United States Patent [19]
Ishida et al.

[11] Patent Number: 6,133,074
[45] Date of Patent: Oct. 17, 2000

[54] THIN FILM TRANSISTOR AND METHOD OF FABRICATING THE SAME

[75] Inventors: Satoshi Ishida, Ogaki; Yasuo Nakahara, Tsukuba, both of Japan; Hiroyuki Kuriyama, Boston, Mass.; Tsutomu Yamada, Ogaki, Japan; Kiyoshi Yoneda, Gifu-ken, Japan; Yasushi Shimogaichi, Tokyo, Japan

[73] Assignees: Sanyo Electric Co., Ltd., Osaka; Sony Corp., Tokyo, both of Japan

[21] Appl. No.: 09/114,813

[22] Filed: Jul. 13, 1998

Related U.S. Application Data

[62] Division of application No. 09/024,855, Feb. 13, 1998.

[51] Int. Cl.[7] .................................................. H01L 21/00
[52] U.S. Cl. ............................................ 438/153; 438/153
[58] Field of Search ..................................... 438/149, 151, 438/153, 154, 158, 164, 166, 486, 487

[56] References Cited

U.S. PATENT DOCUMENTS

| | | |
|---|---|---|
| 4,654,121 | 3/1987 | Miller et al. .............................. 438/158 |
| 5,543,635 | 8/1996 | Nguyen .................................... 438/158 |
| 5,656,824 | 8/1997 | Den Boer et al. ......................... 257/59 |
| 5,728,604 | 3/1998 | Rha et al. ................................. 438/158 |

*Primary Examiner*—David Nelms
*Assistant Examiner*—Dung A Le
*Attorney, Agent, or Firm*—Sheridan Ross P.C.

[57] ABSTRACT

A thin film transistor (TFT) which may be used as a pixel drive element in an active matrix LCD display includes a pair of side wall spacers adjacent to the opposing side walls of its gate electrode. The side wall spacers provide the gate electrode with a substantially rectangular cross section, such that the gate electrode has a substantially constant thermal conductivity over its area. The TFT has a uniform device characteristic.

13 Claims, 8 Drawing Sheets

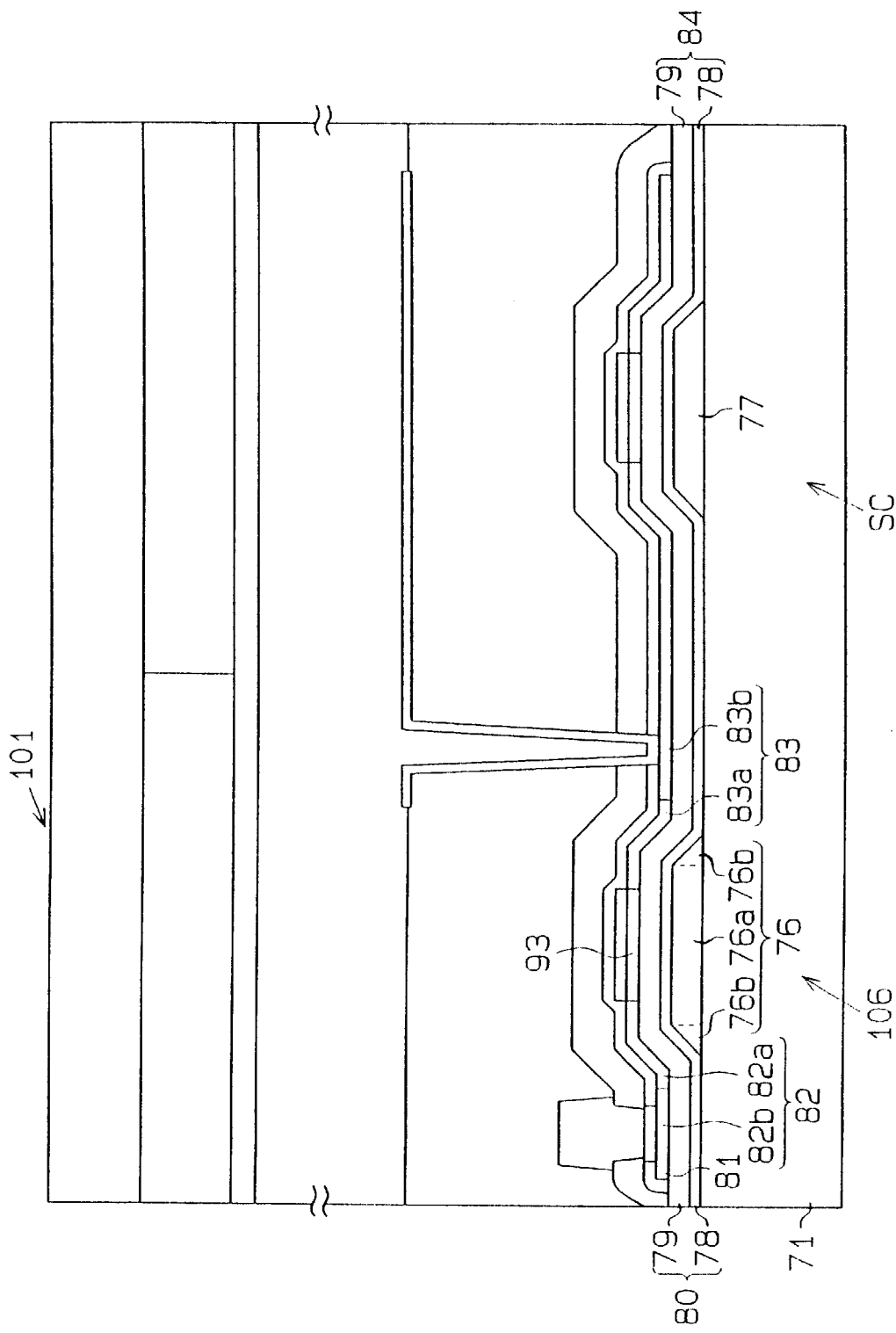

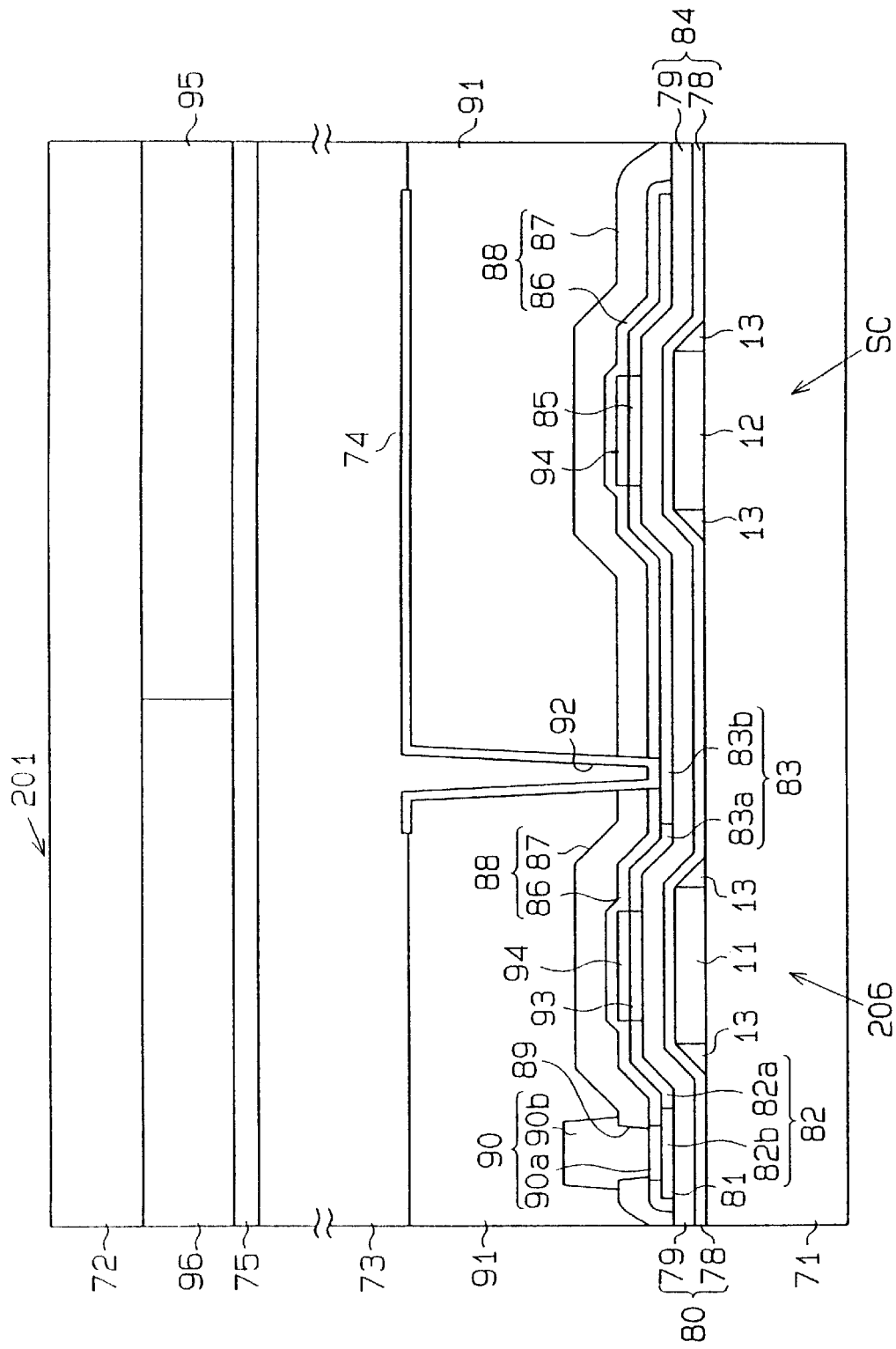

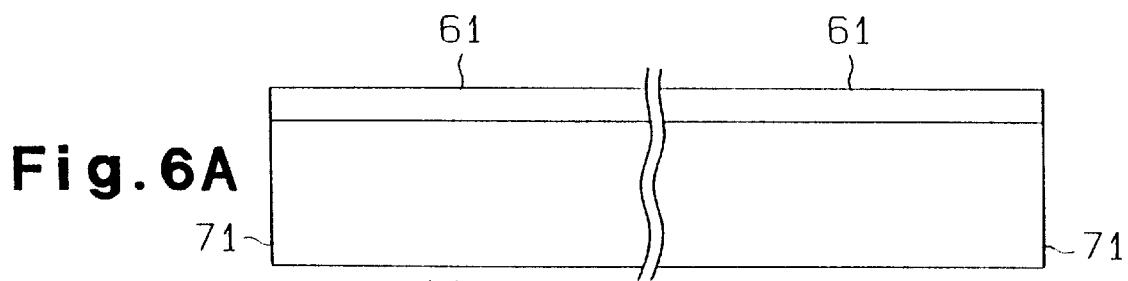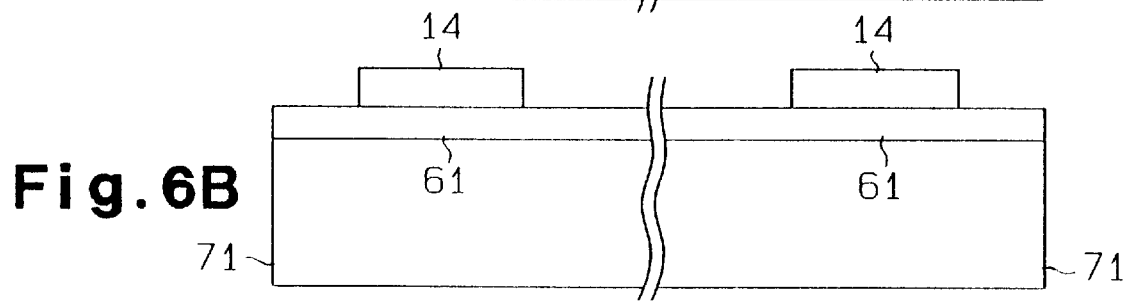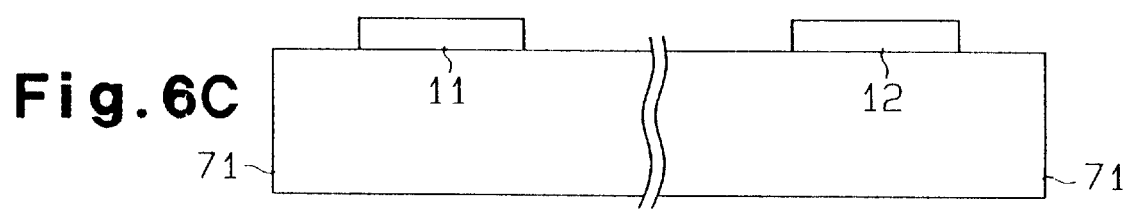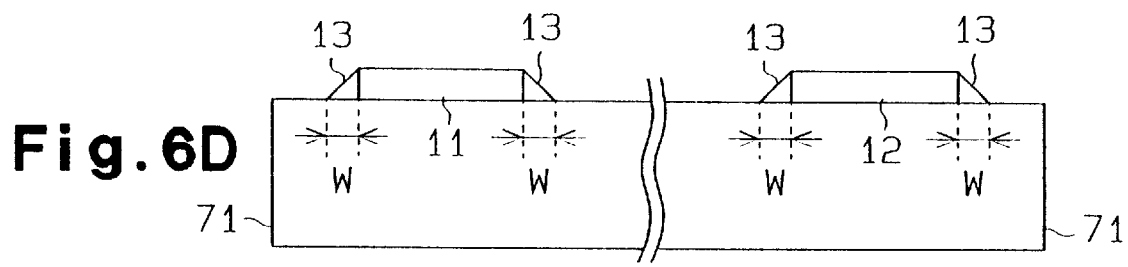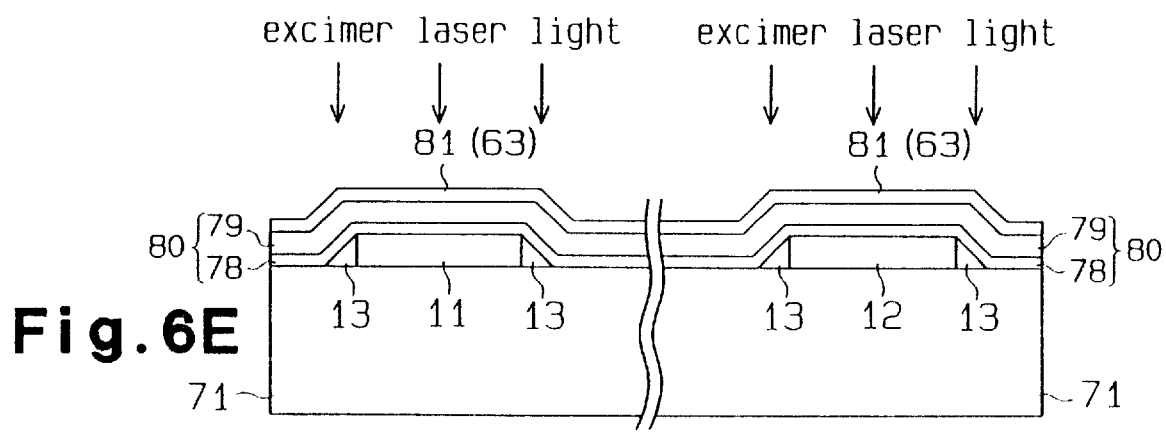

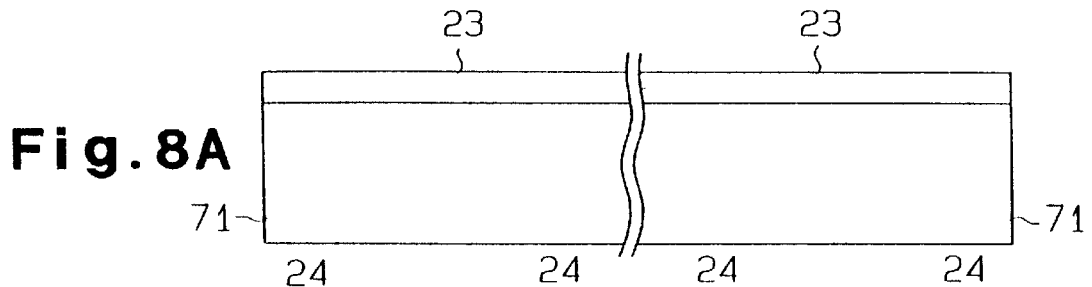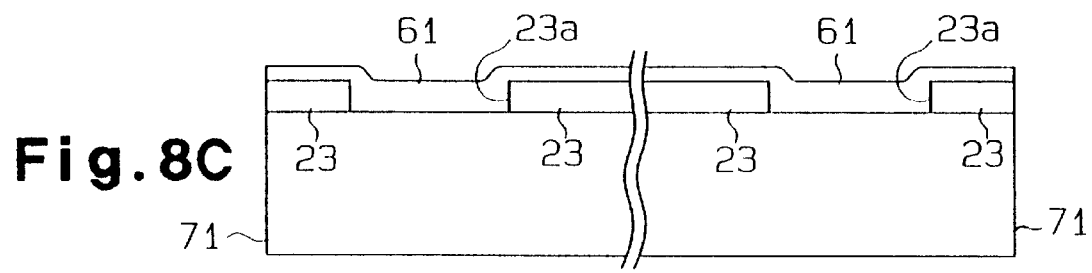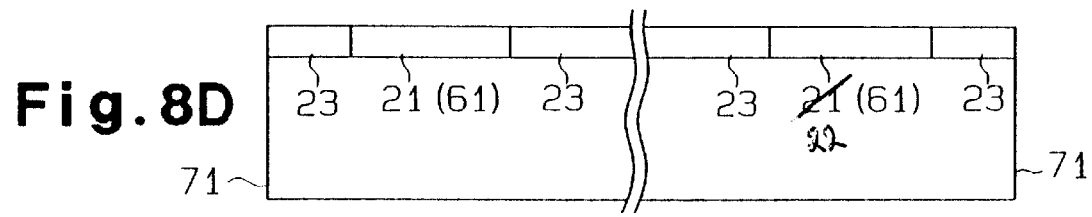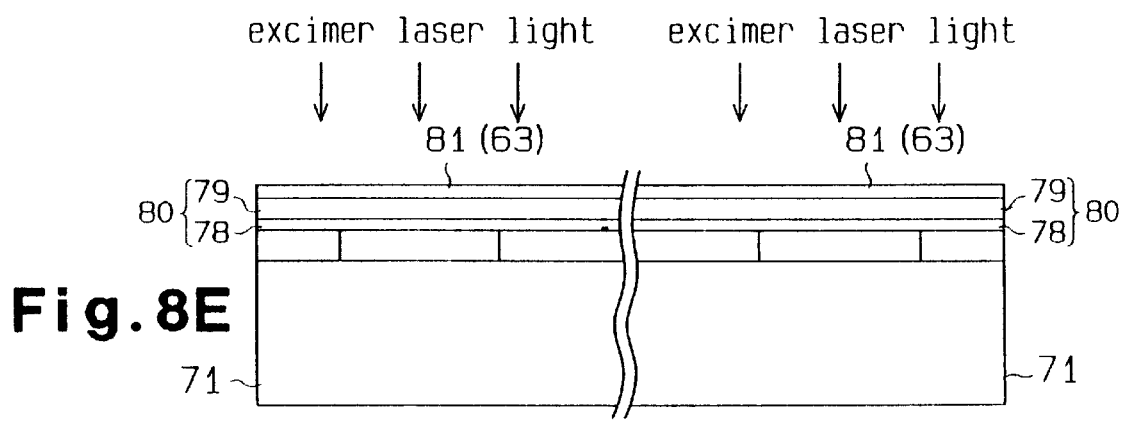

THIN FILM TRANSISTOR AND METHOD OF FABRICATING THE SAME

This is a division of application Ser. No. 09/024,855, filed Feb. 13, 1998.

BACKGROUND OF THE INVENTION

The present invention relates to a thin film transistor suitable for use in an active matrix type display apparatus and a method of fabricating the same.

Liquid crystal displays (LCD) of an active matrix type which use thin film transistors (TFTs) provide a high-quality display apparatus. There are two kinds of dot matrix type LCDs each having a plurality of pixels arranged in a matrix form: a simple matrix type and an active matrix type.

The active matrix type LCD includes pixels, pixel drive elements (active elements) and signal storage elements (storage capacitors or added capacitors) and drives a liquid crystal in a quasi-static manner which permits each pixel to store data. Each pixel drive element serves as a switch which is switched on or off in response to a scan signal. When the pixel drive element is switched on, a data signal (display signal) is transmitted via that pixel drive element to an associated display electrode, so that the liquid crystal is driven by the data signal. When the pixel drive element is disabled, the data signal is stored in the form of a charge in the associated signal storage element. The liquid crystal is kept driven by the discharging of the charge until the pixel drive element is switched on again. Even though the drive time assigned to a single pixel decreases as the number of scan lines increases, the liquid crystal is sufficiently driven. This prevents the contrast from decreasing.

TFTs are generally used as pixel drive elements. A TFT has an active layer comprised of a thin semiconductor film formed on an insulator substrate. The semiconductor film preferably includes an amorphous silicon film or a polycrystalline silicon film. A TFT having an active layer comprised of an amorphous silicon film is called an amorphous silicon TFT, while a TFT having an active layer comprised of a polycrystalline silicon film is called a polycrystalline silicon TFT. The polycrystalline silicon TFT has a greater field effect mobility and higher drive performance than the amorphous silicon TFT. Because of these advantages, the polycrystalline silicon TFT can be used as a logic circuit element as well as a pixel drive element. The use of polycrystalline silicon TFTs, therefore, allows the integration of the display screen and a peripheral drive circuit, located at the periphery of the display screen, and on the same substrate. That is, the display screen and peripheral drive circuit may be formed in the same step.

FIG. 1 is a schematic block diagram of a typical active matrix type LCD. The LCD includes a display panel 101, a gate driver 103, and a drain (data) driver 104. The display panel 101 has a plurality of scan lines (gate lines) G1, . . . , Gn, Gn+1, . . . , and Gm, a plurality of data lines (drain lines) D1, . . . , Dn, Dn+1, . . . , and Dm running perpendicular to the gate lines G1–Gm, and a plurality of pixels 102 provided at the intersections of the gate lines G1–Gm and the drain lines D1–Dm. The gate driver 103, which is connected to the gate lines G1–Gm, applies a gate signal (scan signal) to the gate lines G1–Gm. The drain driver 104, which is connected to the drain lines D1–Dm, applies a data signal (video signal) to the drain lines D1–Dm. Both of the gate driver 103 and the drain driver 104 form a peripheral drive circuit 105. Either one of the drivers 103 and 104 or both are preferably formed on the same substrate on which the display panel 101 is formed. The LCD is generally called a driver-integrated (driver-incorporated) LCD. The gate driver 103 or the drain driver 104 may be provided on both sides of the display panel 101.

FIG. 2 shows an equivalent circuit of one of the pixels 102. The pixel 102 includes a liquid crystal cell LC having a display electrode (pixel electrode) and a common electrode. The liquid crystal cell LC is connected to both a TFT 106 and a supplemental capacitor SC. The supplemental capacitor SC has a storage electrode and an opposing electrode. The TFT 106 has a gate connected to the gate line Gn, a drain connected to the drain line Dn, and a source connected to the display electrode of the liquid crystal cell LC and the storage electrode of the supplemental capacitor SC. The liquid crystal cell LC and the supplemental capacitor SC form a signal storage element. A voltage $V_{com}$ is applied to the common electrode of the liquid crystal cell LC. A predetermined voltage signal $V_R$ is applied to the opposing electrode of the supplemental capacitor SC. The common electrode of the liquid crystal cell LC is common to all of the pixels 102. The liquid crystal cell LC has a capacitor formed between the display electrode and the common electrode.

The writing characteristic and holding characteristic of the pixel 102 are important in improving the quality of displayed image. The writing characteristic shows how much the liquid crystal cell LC and the supplemental capacitor SC can write desired video signals per unit time based on the specifications of the display panel 101. The holding characteristic shows how long the written video signals can be held. The supplemental capacitor SC is provided to increase the capacitance of the pixel to improve the holding characteristic.

When a positive voltage is applied to the gate of the TFT 106 via the gate line Gn, the TFT 106 is turned on and a data signal is applied to the drain line Dn. As a result, the capacitor of the liquid crystal cell LC and the supplemental capacitor SC are charged. If a negative voltage is applied to the gate of the TFT 106, the TFT 106 is turned off. At this time, the capacitor of the liquid crystal cell LC and the supplemental capacitor SC hold the voltage applied to the drain line Dn. In other words, the pixel 102 holds a data signal as the data signal is applied to the associated one of the drain lines D1–Dm by controlling the voltage on the associated one of the gate lines G1–Gm. An image is displayed on the display panel 101 in accordance with the held data signal.

FIG. 3 is a cross-sectional view of a part of the conventional LCD display panel 101 which has polycrystalline silicon TFTs 106 of a bottom gate structure. It is preferable that the display panel 101 is of a transparent type. The method of manufacturing the display panel 101 will be discussed below.

Step 1 (see FIG. 4A): A chromium film 61 is formed on an insulator substrate 71 by sputtering.

Step 2 (see FIG. 4B): A resist pattern 62 for forming a gate electrode 76 and a supplemental capacitor electrode 77 is formed on the chromium film 61.

Step 3 (see FIG. 4C): With the resist pattern 62 used as an etching mask, the chromium film 61 is locally etched off by wet etching to form the gate electrode 76 and the supplemental capacitor electrode 77. At this time, the etching solution permeates the interfaces between both end portions of the resist pattern 62 and the chromium film 61, thereby forming undercuts 61a at parts of the chromium film 61 in the vicinity of both ends of the resist pattern 62. In cross section, therefore, the gate electrode 76 has a flat center portion (flat portion) 76a and a tapered end portion (tapered portion) 76b. The angle between the outer wall of the tapered portion 76b and the insulator substrate 71 is about 45°.

Step 4 (see FIG. 4D): A silicon nitride film 78, a silicon oxide film 79 and an amorphous silicon film 63 are formed in order on the gate and supplemental capacitor electrodes 76 and 77 and the insulator substrate 71 by plasma CVD (Chemical Vapor Deposition). The silicon nitride film 78 and the silicon oxide film 79 form a gate insulator film 80 in the region of the TFT 106, and form a dielectric film 84 in the region of the supplemental capacitor SC. Next, the device is annealed at 400° C. to remove hydrogen from the amorphous silicon film 63 (dehydrogenation treatment). Then, excimer laser light is irradiated on the surface of the amorphous silicon film 63 to heat the film 63, thereby forming a polycrystalline silicon film 81. Such laser annealing using an excimer laser beam is called ELA (Excimer Laser Anneal). Then, a drain region 82, which includes low-concentration and high-concentration regions 82a and 82b, and a source region 83, which includes low-concentration and high-concentration regions 83a and 83b, are formed in the polycrystalline silicon film 81.

The tapered portion 76b of the gate electrode 76 is suitable for the withstanding voltage of the gate insulator film 80. That is, the tapered portion 76b prevents electrolytic concentration at the end portions of the gate electrode 76. The tapered portion 76b also improves the coverage of the gate insulator film 80 with respect to the both end portions of the gate electrode 76 to thereby allow the gate insulator film 80 to have a uniform thickness.

Because the gate electrode 76 is formed by the chromium film 61 which has a high thermal conductivity, heat escapes from the gate electrode 76 in the ELA process. The annealing temperature of a first portion of the amorphous silicon film 63 above the gate electrode 76 is lower than that of a second portion of the amorphous silicon film 63 above the insulator substrate 71. Since the degree of heat transfer of the tapered portion 76b is lower than that of the flat portion 76a, the annealing temperature of a third portion of the amorphous silicon film 63 above the flat portion 76a is lower than that of a fourth portion of the amorphous silicon film 63 above the tapered portion 76b. Therefore, the first portion of the amorphous silicon film 63 requires greater crystallization laser energy than the second portion. Further, the third portion of the amorphous silicon film 63 needs greater crystallization laser energy than the fourth portion.

High laser irradiation energy increases the grain size (crystal grain size) of the polycrystalline silicon film 81. Accordingly, a first portion of the polycrystalline silicon film 81 above the gate electrode 76 has a smaller grain size than a second portion of the polycrystalline silicon film 81 above the insulator substrate 71. Further, a third portion of the polycrystalline silicon film 81 above the flat portion 76a has a smaller grain size than a fourth portion of the polycrystalline silicon film 81 above the tapered portion 76b.

As shown in FIG. 3, a channel region 93 is defined in the third portion of the polycrystalline silicon film 81, the low-concentration regions 82a and 83a of the drain region 82 and source region 83 are defined in the fourth portion of the polycrystalline silicon film 81, and the high-concentration regions 82b and 83b of those regions 82 and 83 are defined in the second portion of the polycrystalline silicon film 81. The grain sizes thus become smaller in the order of the high-concentration regions 82b and 83b, the low-concentration regions 82a and 83a, and the channel region 93. The different grain sizes make it difficult to obtain a plurality of TFTs 106 with a uniform device characteristic, which degrades the quality of a displayed image.

In the formation of the tapered portion 76b using wet etching in step 3 (FIG. 4C), the angle between the outer wall of the tapered portion 76b and the insulator substrate 71 may vary. This is because, when the insulator substrate 71 of a relatively large size is used, different undercuts 61a appear at the associated portions of the insulator substrate 71. The different undercuts 61a are produced due to the difference between the temperatures of the etching solution at the center portion and end portions of the insulator substrate 71.

Such a variation in taper angle results in different thermal conductivities of the tapered portion 76b. Therefore, the annealing temperature, or the grain size, of a part of the amorphous silicon film 63 above the tapered portion 76b varies. This makes it difficult to acquire a plurality of TFTs 106 with a uniform device characteristic. Possible causes for the variation in grain size are (1) the attenuation of the ELA energy density caused by the inclined outer wall of the tapered portion 76b and (2) a local change in the state of the interface between the amorphous silicon film 63 and the gate insulator film 80.

It is an object of the present invention to provide thin film transistors which have a uniform device characteristic.

SUMMARY OF THE INVENTION

Briefly stated, the present invention provides a thin film transistor including: an insulator substrate; a gate electrode having a pair of opposing side walls and located on the insulator substrate; a pair of side wall spacers formed adjacent to both of the side walls of the gate electrode, on the insulator substrate; a gate insulator film located above the insulator substrate, the gate electrode and the pair of side wall spacers; and a polycrystalline silicon film located on the gate insulator film.

The present invention provides a thin film transistor including: an insulator substrate; a gate electrode having a pair of opposing side walls and located on the insulator substrate; a flattening insulator film provided adjacent to each of the side walls of the gate electrode, on the insulator substrate, the flattening insulator film being substantially equal in thickness to the gate electrode; a gate insulator film provided above the gate electrode and the flattening insulator film; and a polycrystalline silicon film located on the gate insulator film.

The present invention provides a thin film transistor including: an insulator substrate; a gate electrode having a pair of opposing side walls formed on the insulator substrate; a pair of side wall spacers formed adjacent to the gate electrode side walls, wherein the side wall spacers prevent the gate electrode side walls from tapering such that the gate electrode has a substantially constant thermal conductivity over its area; a gate insulator film formed above the insulator substrate, the gate electrode and the side wall spacers; and a polycrystalline silicon film formed on the gate insulator film.

The present invention provides a thin film transistor including: an insulator substrate; a gate electrode located on the insulator substrate; a gate insulator film provided above the insulator substrate and the gate electrode; and a polycrystalline silicon film located on the gate insulator film, the polycrystalline silicon film being formed by irradiating a laser beam on a surface of an amorphous silicon film to heat the amorphous silicon film. The gate electrode has a center portion with a flat surface and a pair of tapered end portions with inclined surfaces. An angle between each of the inclined surfaces of the pair of tapered end portions and a surface of the insulator substrate is set within a range of 5° to 40°.

The present invention provides a method of fabricating a thin film transistor including the steps of: forming a gate electrode having a pair of opposing side walls on an insulator substrate; forming a pair of side wall spacers, each one of the spacers being located adjacent to a respective one of the side walls of the gate electrode; forming a gate insulator film above the insulator substrate, the gate electrode and the pair of side wall spacers; forming an amorphous silicon film on the gate insulator film; and heating the amorphous silicon film to form a polycrystalline silicon film.

The present invention provides a method of fabricating a thin film transistor including the steps of: forming a flattening insulator film on an insulator substrate; locally removing the flattening insulator film to partially expose a surface of the insulator substrate; forming a gate electrode on the partially exposed surface of the insulator substrate, the gate electrode being substantially equal in thickness to the flattening insulator film; forming a gate insulator film above the gate electrode and the flattening insulator film; forming an amorphous silicon film on the gate insulator film; and heating the amorphous silicon film to form a polycrystalline silicon film.

The present invention provides a method of fabricating a thin film transistor including the steps of: forming a gate electrode having a pair of opposing side walls on an insulator substrate; forming a flattening insulator film on the insulator substrate, the flattening insulator film being adjacent to both of the side walls of the gate electrode and being substantially equal in thickness to the gate electrode; forming a gate insulator film above the gate electrode and the flattening insulator film; forming an amorphous silicon film on the gate insulator film; and heating the amorphous silicon film to form a polycrystalline silicon film.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 3 is a partly schematic cross-sectional view of a conventional display panel;

FIG. 5 is a partly schematic cross-sectional view of an LCD display panel according to a first embodiment of the present invention;

FIGS. 6A through 6E are partly schematic cross-sectional views showing steps of manufacturing the LCD display panel of the first embodiment;

FIGS. 8A through 8E are partly schematic cross-sectional views showing steps of manufacturing the LCD display panel of the second embodiment.

DETAILED DESCRIPTION OF THE PREFERRED EMBODIMENTS

Figure 1:
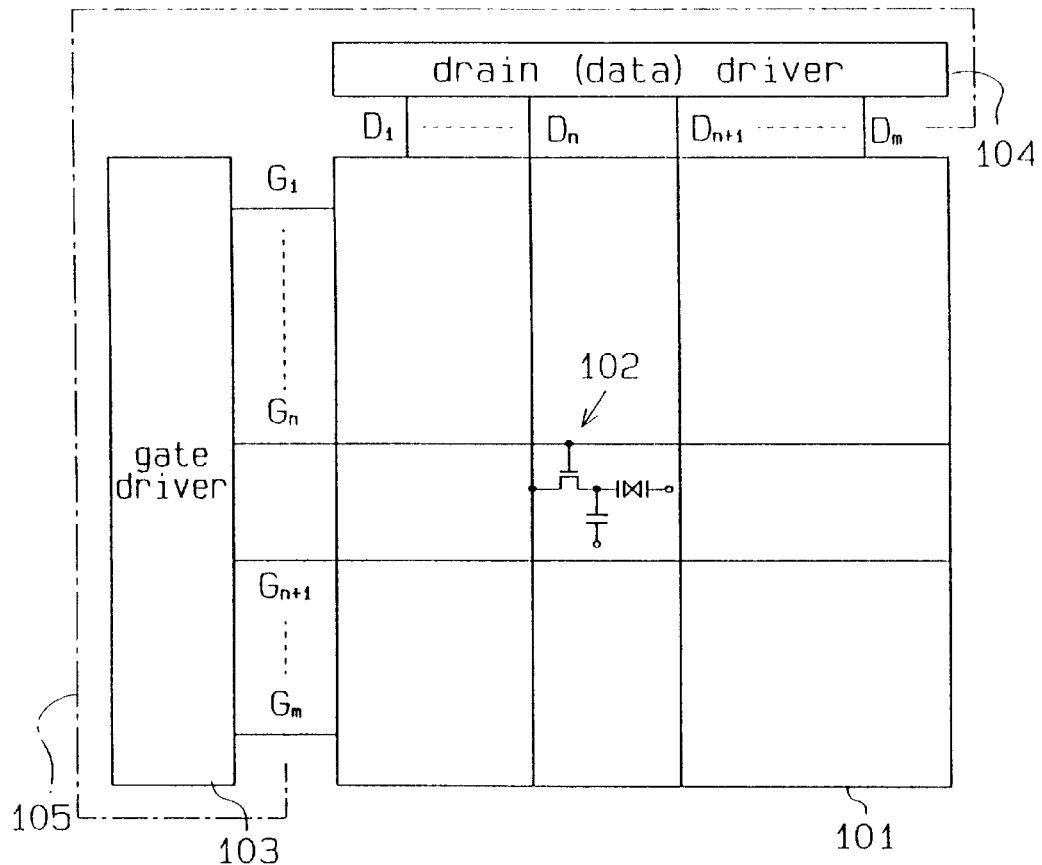
FIG. 1 is a schematic block diagram of a conventional active matrix type LCD.
Figure 2:
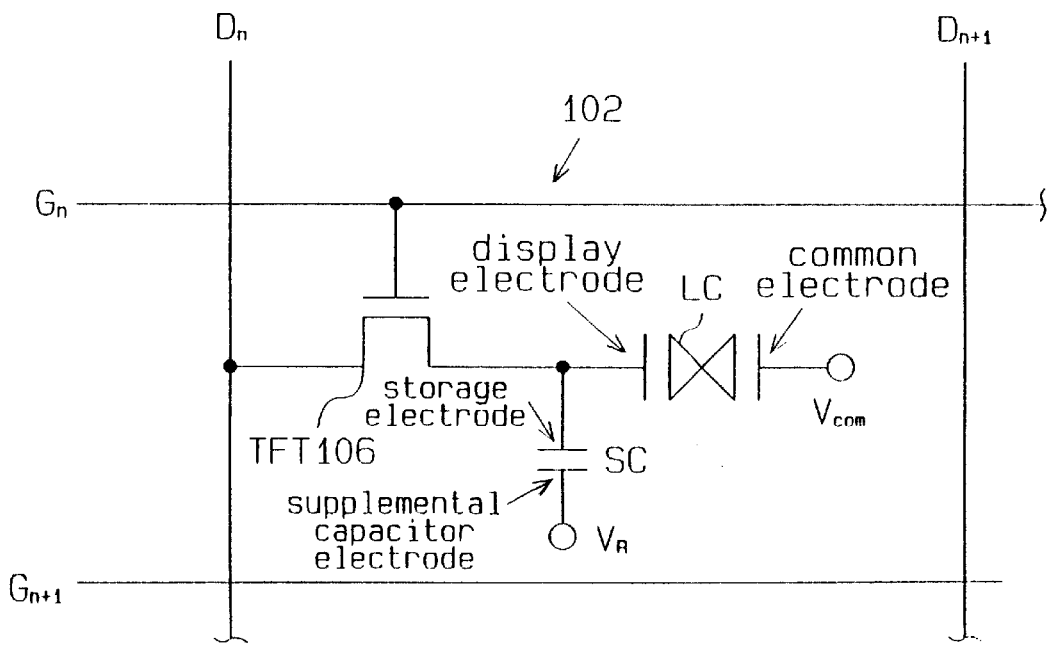
FIG. 2 is an equivalent circuit diagram of a pixel in an LCD display panel.
Figure 4A:
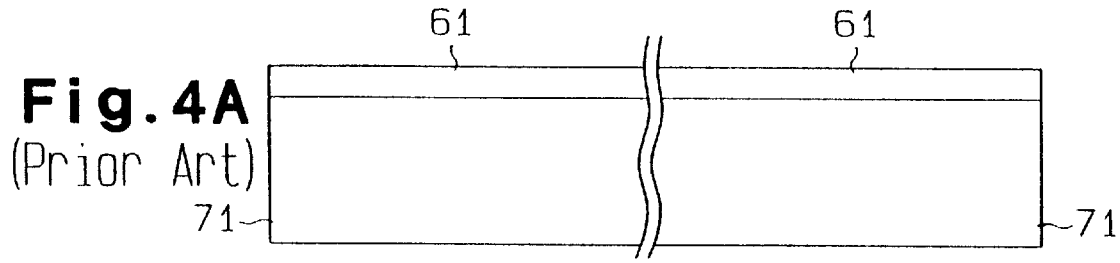
FIGS. 4A–4D are schematic cross sections explaining the fabrication steps of the prior art LCD display panel.
Figure 4B:
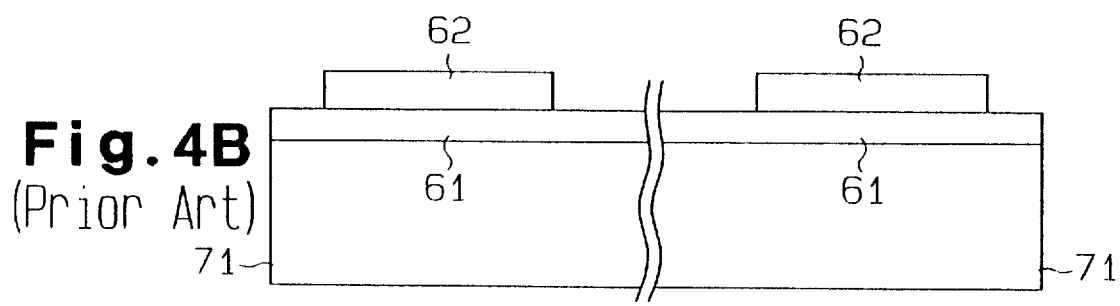
Figure 4C:
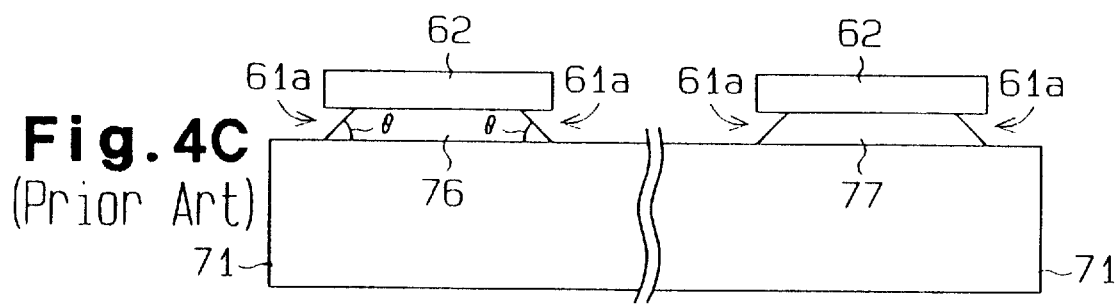
Figure 4D:
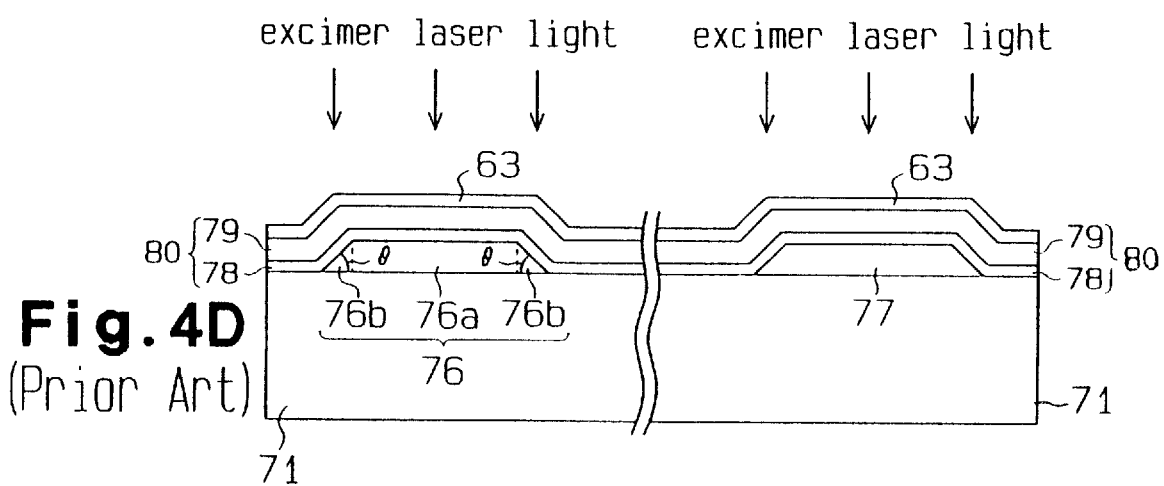

In the drawings, like numerals are used to refer to corresponding elements.

First Embodiment

A display apparatus which has thin film transistors (TFTs) according to a first embodiment of the present invention will now be described with reference to the accompanying drawings. FIG. 5 is a partly schematic cross-sectional view of an LCD display panel 201 according to one embodiment of the present invention, which has polycrystalline silicon TFTs 206 of a bottom gate structure. The display panel 201 is incorporated into the active matrix type LCD in FIG. 1.

According to the first embodiment, a gate electrode 11 of a TFT 206 and a supplemental capacitor electrode 12 of a supplemental capacitor SC have generally rectangular cross sections. Provided on both side walls of the gate electrode 11 and the supplemental capacitor electrode 12 are side wall spacers 13 of an SOG (Spin On Glass) film. Preferably, the SOG film comprises a solution of silicon dioxide as a main component in which a silicon compound is dissolved in an organic solvent. Unlike in the prior art, the gate electrode 11 and the supplemental capacitor electrode 12 do not have tapered portions. That is, the side wall spacers 13 insure that the gate electrode 11 and the supplemental capacitor electrode have a rectangular cross-section without tapered ends.

The rectangular cross section of the gate electrode 11 prevents a variation in taper angle and a variation in grain size of a part of the polycrystalline silicon film 81 above the tapered portion 76b in the prior art. This permits a plurality of TFTs 206 having substantially uniform device characteristics to be formed on an insulator substrate 71 and thus improves the quality of displayed images.

The adjoining side wall spacers 13 of the gate electrode 11 improve the coverage of a gate insulator film 80 at both end portions of the gate electrode 11, and secure a sufficient withstand voltage between the gate electrode 11 and the polycrystalline silicon film 81.

The SOG film includes an inorganic SOG film which does not contain an organic component in a silicon compound as represented by the general formula (1), and an organic SOG film which contains an organic component in a silicon compound as represented by the general formula (2).

$$[SiO_2]_n \qquad (1)$$

$$[R_X SiO_Y]_n \qquad (2)$$

(n, X, Y: integers, R: alkyl group or aryl group)

An inorganic SOG film contains large amounts of water and hydroxyl groups, and thus has a high hygroscopicity. The inorganic SOG film is more fragile than a silicon oxide film formed by CVD, and is likely to have cracks in a heat treatment if its thickness is set equal to or greater than 0.5 $\mu$m.

An organic SOG film has a molecular structure with a bond closed with an alkyl group or aryl group. This molecular structure provides a film which is approximately 0.5 $\mu$m to 1.0 $\mu$m in thickness while suppressing the occurrence of cracks in a heat treatment. When the gate electrode 11 and the supplemental capacitor electrode 12 are relatively thick, therefore, it is preferable to form the side wall spacers 13 using an organic SOG film.

Referring to FIG. 5, the display panel 201 has a pair of insulator substrates 71 and 72 facing each other, a liquid crystal (LC) layer 73 located between both insulator substrates, and a flattening insulator film 91 located between the LC layer 73 and the insulator substrate 71. Both insulator substrates 71 and 72 are preferably transparent. A display electrode 74 of an liquid crystal cell LC is provided on the first surface of the LC layer 73 which faces the flattening insulator film 91. A common electrode 75 of the liquid crystal cell LC is provided on the second surface of the LC layer 73 which faces the insulator substrate 72.

The TFT 206 and a supplemental capacitor SC are arranged in parallel between the flattening insulator film 91 and the insulator substrate 71. The TFT 206 includes the gate electrode 11, a gate insulator film 80, the drain region 82, the source region 83, and a channel region 93 located between the drain region 82 and the source region 83. The TFT 206 is preferably formed into an LDD (Lightly Doped Drain) structure. The LDD structure increases the OFF resistance of the TFT 206 and improves the holding characteristic thereof. The gate electrode 11, located on the insulator substrate 71, forms a gate line Gn. The gate insulator film 80 includes a silicon nitride film 78, provided on the gate electrode 11 and the insulator substrate 71, and a silicon oxide film 79 provided on the silicon nitride film 78. The drain region 82, the source region 83 and the channel region 93 are defined in the polycrystalline silicon film 81 on the gate insulator film 80. Specifically, the channel region 93 is defined in a first portion of the polycrystalline silicon film 81 on the gate electrode 11. The drain region 82 includes a low-concentration region 82a defined in a second portion of the polycrystalline silicon film 81 on a part of the gate electrode 11 and above the side wall spacers 13, and a high-concentration region 82b defined in a third portion of the polycrystalline silicon film 81 above the insulator substrate 71. The source region 83 includes a low-concentration region 83a defined in a fourth portion of the polycrystalline silicon film 81 on a part of the gate electrode 11 and above the side wall spacers 13, and a high-concentration region 83b defined in a fifth portion of the polycrystalline silicon film 81 above the insulator substrate 71.

The supplemental capacitor SC includes the supplemental capacitor electrode (opposing electrode) 12, a dielectric film 84 and a storage electrode 85. The supplemental capacitor SC is formed in the same step as the TFT 206. The supplemental capacitor electrode 12, located on the insulator substrate 71, is formed in the same step as the gate electrode 11. The dielectric film 84, located on the supplemental capacitor electrode 12, is formed integral with the gate insulator film 80. The storage electrode 85 is defined in the polycrystalline silicon film 81 located on the dielectric film 84, and is connected to the source region 83 of the TFT 206.

Stopper layers 94 are respectively provided on a channel region 93 and the storage electrode 85. The stopper layers 94 are preferably formed of a silicon oxide film. Provided on the TFT 206 and the supplemental capacitor SC is an interlayer insulator film 88 which includes a first silicon oxide film 86 and a second silicon nitride film 87.

The high-concentration region 82b of the drain region 82 is connected to a drain electrode 90 via a contact hole 89 which is formed in the interlayer insulator film 88. The drain electrode 90 includes a molybdenum layer 90a located on the high-concentration region 82b and an aluminum alloy layer 90b located on the molybdenum layer 90a, and forms a drain line Dn. The high-concentration region 83b of the source region 83 is connected to the display electrode 74 via a contact hole 92 formed in the flattening insulator film 91 and the interlayer insulator film 88. The display electrode 74 is preferably formed of ITO (Indium Tin Oxide).

A color filter 95 and a black matrix 96 are located in parallel between the common electrode 75 and the insulator substrate 72. The color filter 95 preferably includes three color filters corresponding to the three primary colors of red, green and blue (RGB). The black matrix 96 is located between the color filters 95 and serves as a light-shielding film. It is preferable that the color filter 95 is provided above the display electrode 74 and the black matrix 96 is provided above the TFT 206.

The steps of manufacturing the LCD display panel 201 according to the first embodiment will now be discussed with reference to FIGS. 6A through 6E.

Step 1 (see FIG. 6A): A chromium film 61 is formed on the insulator substrate 71 by sputtering.

Step 2 (see FIG. 6B): A resist pattern 14 for forming the gate electrode 11 and the supplemental capacitor electrode 12 is formed on the chromium film 61.

Step 3 (see FIG. 6C): With the resist pattern 14 used as a mask, the chromium film 61 is locally etched off by anisotropic etching, yielding the gate electrode 11 and the supplemental capacitor electrode 12.

Step 4 (see FIG. 6D): The side wall spacers 13 are formed on both side walls of the gate electrode 11 and the supplemental capacitor electrode 12. Specifically, a solution of a silicon compound dissolved in an organic solvent is dropped on the insulator substrate 71 while spinning the insulator substrate 71, thereby forming an SOG film. The SOG film may be formed of polyimide resin, acrylic resin or epoxy resin. The amount of drops of the solution and the spinning speed of the insulator substrate 71 preferably form the side wall spacers 13 only on both side walls of the gate electrode 11 and the supplemental capacitor electrode 12. The amount of drops of the solution and the spinning speed of the insulator substrate 71 are provided such that the side wall spacers 13 at the side walls of the gate electrode 11 and the supplemental capacitor electrode 12 have uniform widths W. The width W preferably is equal to or greater than 0.2 $\mu$m when the side wall spacers 13 have a thickness of about 1000 Å. The side wall spacers 13 are hardened by evaporating the organic solvent in the SOG film by annealing and accelerating the polymerization reaction of the silicon compound.

Alternately, in step 4, a silicon oxide film is formed on the gate electrode 11, the supplemental capacitor electrode 12 and the insulator substrate 71 by CVD. Then side wall spacers comprised of a silicon oxide film are formed by full etch-back. In this case, a silicon nitride film may be used in place of a silicon oxide film.

Further, a film which contains a metal film of various metals including a high-melting point metal, a silicon oxide film or a silicon nitride film, may be formed on the gate electrode 11, the supplemental capacitor electrode 12 and the insulator substrate 71 by PVD (Physical Vapor Deposition), after which the side wall spacers 13 may be formed by full etch-back.

Step 5 (see FIG. 6E): The silicon nitride film 78, the silicon oxide film 79 and an amorphous silicon film 63 are deposited in order on the gate electrode 11, the supplemental capacitor electrode 12, the side wall spacers 13 and the insulator substrate 71 by plasma CVD. As a result, the gate insulator film 80 comprised of the silicon nitride film 78 and the silicon oxide film 79 is formed.

Next, the device is annealed at 400° C. to remove hydrogen from the amorphous silicon film 63 (dehydrogenation treatment). Then, using ELA, excimer laser light is irradiated on the surface of the amorphous silicon film 63 to heat the film 63, thereby forming the polycrystalline silicon film 81. At this time, pulses of the excimer laser beam having an irradiation area of about 150×0.3 mm are preferably irradiated. Further, the scanning of the laser beam is carried out so that the laser beam is irradiated on the entire surface of the amorphous silicon film 63 on the insulator substrate 71. Thereafter, the drain region 82 and the source region 83 are formed in the polycrystalline silicon film 81.

Second Embodiment

Figure 7:
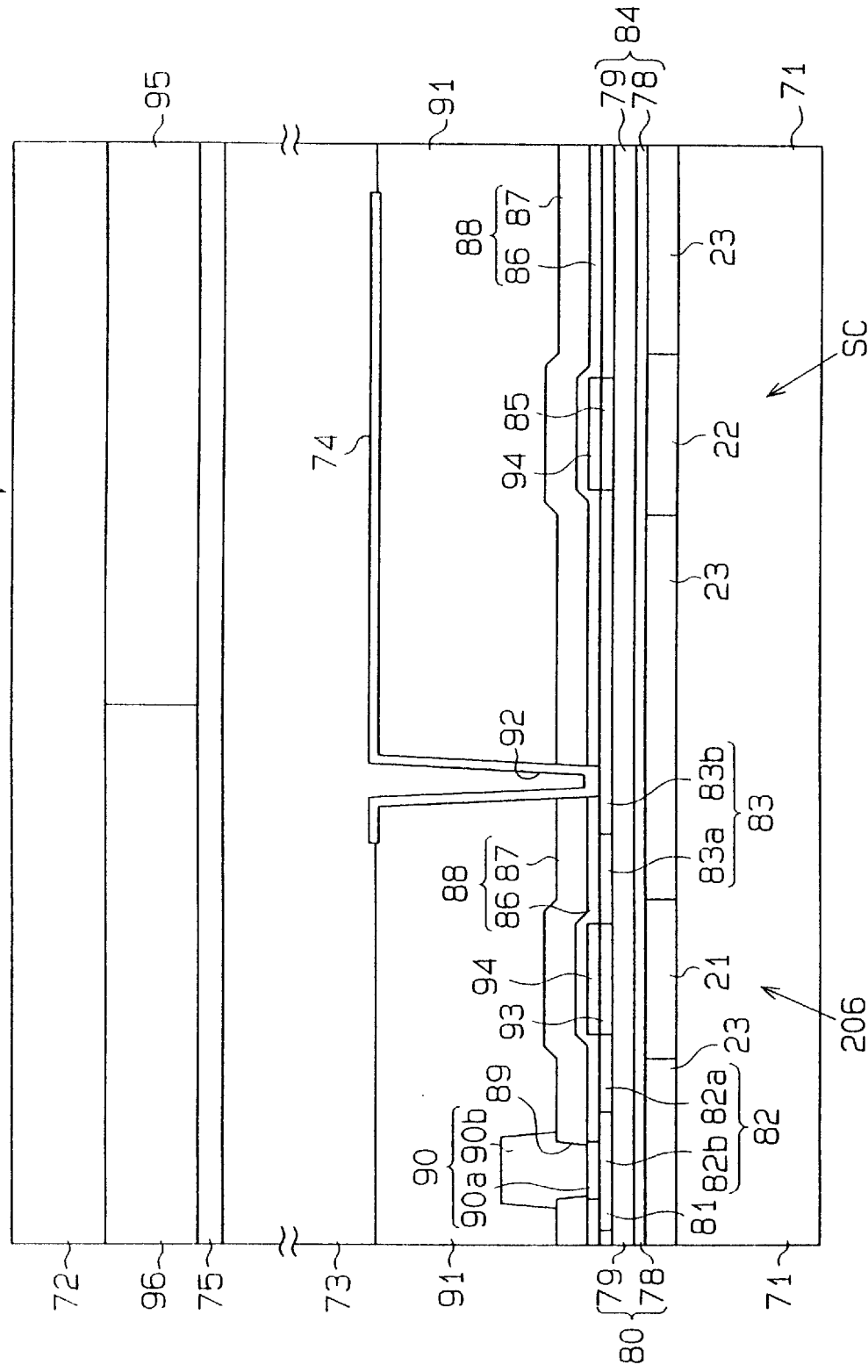
FIG. 7 is a partly schematic cross-sectional view of an LCD display panel according to a second embodiment of the present invention.

FIG. 7 is a partly schematic cross-sectional view of an LCD display panel 301 which has polycrystalline silicon TFTs 206 of a bottom gate structure according to a second embodiment of the present invention.

According to the second embodiment, a gate electrode 21 of the TFT 206 and a supplemental capacitor electrode 22 of a supplemental capacitor SC have rectangular cross sections. A flattening insulator film 23 is formed on the insulator substrate 71 between the gate electrode 21 and the supplemental capacitor electrode 22. The flattening insulator film 23 adjoins both side walls of the gate electrode 21 and has substantially the same thickness as the gate electrode 21 and the supplemental capacitor electrode 22. In other words, one flattening layer including the gate electrode 21, the supplemental capacitor electrode 22 and the flattening insulator film 23 is formed on the insulator substrate 71. The polycrystalline silicon film 81 (amorphous silicon film 63) located above the gate electrode 21, the supplemental capacitor electrode 22 and the flattening insulator film 23 has a uniform thickness and a flat surface. The flat amorphous silicon film 63 facilitates uniform irradiation of an excimer laser beam on the entire surface of the amorphous silicon film 63. That is, uniform ELA energy is applied to the amorphous silicon film 63.

The gate insulator film 80 located on the gate electrode 21, the supplemental capacitor electrode 22 and the flattening insulator film 23 has a uniform thickness and a flat surface too. A sufficient withstand voltage is thus secured between the gate electrode 21 and the polycrystalline silicon film 81. Since the flattening insulator film 23 has a sufficiently lower thermal conductivity than the gate electrode 21 and the supplemental capacitor electrode 22, it is not necessary to consider the thermal conductivity of the flattening insulator film 23.

The steps of manufacturing the LCD display panel according to the second embodiment will now be discussed with reference to FIGS. 8A through 8E.

Step 1 (see FIG. 8A): The flattening insulator film 23 is formed on the insulator substrate 71 by CVD. The flattening insulator film 23 preferably includes a silicon oxide film or a silicon nitride film. The flattening insulator film 23 may be formed by PVD.

Step 2 (see FIG. 8B): A resist pattern 24 for forming the gate electrode 21 and the supplemental capacitor electrode 22 is formed on the flattening insulator film 23.

Step 3 (see FIG. 8C): With the resist pattern 24 used as a mask, the flattening insulator film 23 is partially etched off by anisotropic etching. This forms recesses 23a in the flattening insulator film 23 to expose the surface of the insulator substrate 71. Next, the chromium film 61 is formed on the flattening insulator film 23 and the exposed surfaces of the insulator substrate 71 by sputtering. At this time, the chromium film 61 is so formed as to completely fill the recesses 23a.

Step 4 (see FIG. 8D): Parts of the chromium film 61 lying on the flattening insulator film 23 are removed by full etch-back. This flattens the surface of a layer which includes the flattening insulator film 23 and the chromium film 61.

The gate electrode 21 and the supplemental capacitor electrode 22 are formed of the chromium film 61 filled in the recesses 23a.

Step 5 (see FIG. 8E): The silicon nitride film 78, the silicon oxide film 79 and the amorphous silicon film 63 are deposited in order on the gate electrode 21, the supplemental capacitor electrode 22 and the flattening insulator film 23 by plasma CVD. The silicon nitride film 78 and the silicon oxide film 79 form the gate insulator film 80.

Next, the device is annealed at approximately 400° C. to remove hydrogen from the amorphous silicon film 63.

Then, using ELA, excimer laser light is irradiated on the surface of the amorphous silicon film 63 to heat the film 63. The laser light crystallizes the amorphous silicon film 63 to form the polycrystalline silicon film 81. Thereafter, the drain region 82 and the source region 83 are formed in the polycrystalline silicon film 81.

In the second embodiment, the gate electrode 21 and the supplemental capacitor electrode 22 may alternatively formed first, and then the flattening insulator film 23 may be formed on the gate electrode 21 and the supplemental capacitor electrode 22 by CVD or PVD. Then, the flattening insulator film 23 on the gate electrode 21 and the supplemental capacitor electrode 22 is locally etched off by full etch-back, thus yielding a flat layer.

In the second embodiment, the gate electrode 21 and the supplemental capacitor electrode 22 may be formed first, and then a coating of film (an SOG film, polyimide resin film, acrylic resin film or epoxy resin film) may be formed between the gate electrode 21 and the supplemental capacitor electrode 22 by spin coating, thereby forming a flat layer.

Third Embodiment

Figure 9:
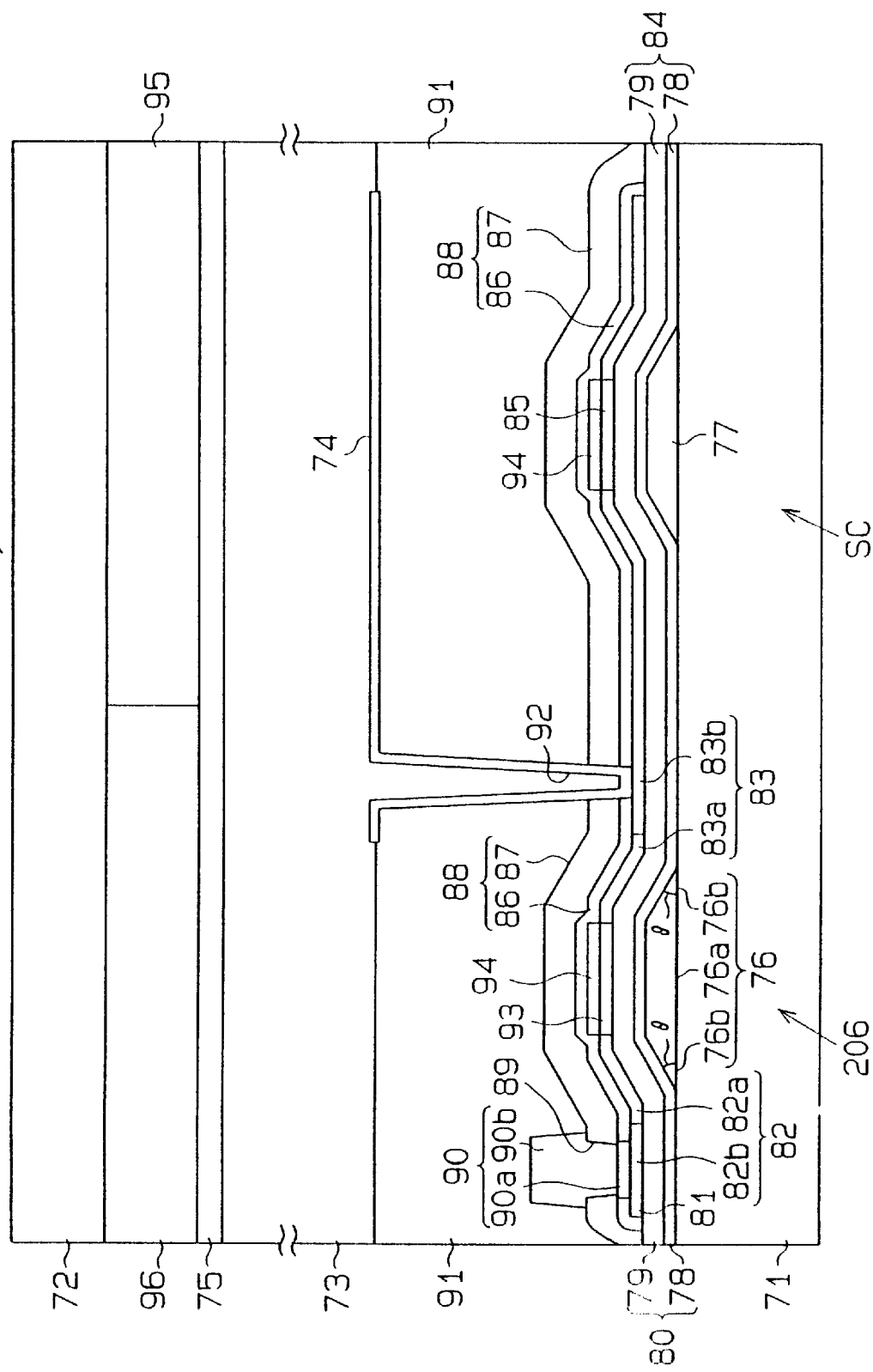
FIG. 9 is a partly schematic cross-sectional view of an LCD display panel according to a third embodiment of the present invention.

FIG. 9 presents a partly schematic cross-sectional view of an LCD display panel 401 which has polycrystalline silicon TFTs 206 of a bottom gate structure according to a third embodiment of the present invention.

According to the third embodiment, the angle between the outer wall of a tapered portion 76b of a gate electrode 76 and the surface of the insulator substrate 71 is set within a range of 5° to 40°, which has been experimentally determined. Even if the angle varies as long as it lies within this range, the polycrystalline silicon film 81 with a uniform grain size is acquired. The preferable angle range is 5° to 40°, and 10° to 30° is more preferable. An angle greater than 40° reduces the coverage of the gate insulator film 80 to lower the gate withstand voltage. An angle smaller than 5° means an increased surface of the tapered portion 76b, which causes a variation in the membranous of the polycrystalline silicon film 81. This degrades the uniformity of the device characteristic.

It should be apparent to those skilled in the art that the present invention may be embodied in many other specific forms without departing from the spirit or scope of the invention.

For example, the gate electrodes 11, 21, 76 and the supplemental capacitor electrodes 12, 22 and 77 may be formed of a single film such as of molybdenum, tungsten, tantalum, hafnium, zirconium, niobium, titanium, vanadium, rhenium, iridium, osmium or rhodium, a film of a high-melting point metal alloy, or multiple layers of high-melting point metal films. The present invention may be adapted to a TFT of an SD (Single Drain) structure or a double gate structure. The present invention may also be adapted to a close-contact type image sensor or three-dimensional IC by replacing the insulator substrate 71 with a ceramic substrate or an insulator layer like a silicon oxide film. The TFT of the present invention may be used for a pixel drive element in an active matrix type display apparatus which uses electroluminescence elements as pixels. Therefore, the present examples and embodiments are to be considered as illustrative and not restrictive and the invention is not to be limited to the details given herein, but may be modified within the scope and equivalence of the appended claims.

What is claimed is:

1. A method of fabricating a thin film transistor comprising the steps of:
    forming a gate electrode having a pair of opposing side walls on an insulator substrate;
    forming a pair of side wall spacers, each one of the spacers being located adjacent to a respective one of the side walls of the gate electrode and having a triangular shape forming a gate insulator film above the insulator substrate, the gate electrode and the pair of side wall spacers;
    forming an amorphous silicon film on the gate insulator film; and
    heating the amorphous silicon film to form a polycrystalline silicon film.

2. The method according to claim 1, wherein the side wall spacers comprise an SOG film.

3. The method according to claim 2, wherein the step of forming the polycrystalline silicon film includes a step of irradiating a laser beam on a surface of the amorphous silicon film to heat the amorphous silicon film, thereby forming the polycrystalline silicon film.

4. A method of fabricating a thin film transistor comprising the steps of:
    forming a flattening insulator film on an insulator substrate;
    locally removing the flattening insulator film to partially expose a surface of the insulator substrate;
    forming a gate electrode on the partially exposed surface of the insulator substrate, the gate electrode being substantially equal in thickness to the flattening insulator film;
    forming a gate insulator film above the gate electrode and the flattening insulator film;
    forming an amorphous silicon film on the gate insulator film;
    removing hydrogen from the amorphous silicon film; and
    heating the amorphous silicon film to form a polycrystalline silicon film.

5. The method according to claim 4, wherein the step of forming the polycrystalline silicon film includes a step of irradiating a laser beam on a surface of the amorphous silicon film to heat the amorphous silicon film, thereby forming the polycrystalline silicon film.

6. The method according to claim 4, wherein the flattening insulator film prevents the side walls of the gate electrode from tapering.

7. The method according to claim 4, wherein the gate electrode has a substantially rectangular cross section.

8. The method according to claim 4, wherein the gate electrode has a substantially constant thermal conductivity over its area.

9. A method of fabricating a thin film transistor comprising the steps of:
    forming a gate electrode having a pair of opposing side walls on an insulator substrate;
    forming a flattening insulator film on the insulator substrate, the flattening insulator film being adjacent to both of the side walls of the gate electrode and being substantially equal in thickness to the gate electrode;
    forming a gate insulator film above the gate electrode and the flattening insulator film;
    forming an amorphous silicon film on the gate insulator film; and
    heating the amorphous silicon film to form a polycrystalline silicon film.

10. The method according to claim 9, wherein the step of forming the polycrystalline silicon film includes a step of irradiating a laser beam on a surface of the amorphous silicon film to heat the amorphous silicon film, thereby forming the polycrystalline silicon film.

11. The method according to claim 9, wherein the flattening insulator film prevents the side walls of the gate electrode from tapering.

12. The method according to claim 9, wherein the gate electrode has a substantially rectangular cross section.

13. The method according to claim 9, wherein the gate electrode has a substantially constant thermal conductivity over its area.

* * * * *

UNITED STATES PATENT AND TRADEMARK OFFICE
CERTIFICATE OF CORRECTION

PATENT NO. : 6,133,074
DATED : October 17, 2000
INVENTOR(S) : Ishida et al.

It is certified that error appears in the above-identified patent and that said Letters Patent is hereby corrected as shown below:

<u>Title page,</u>
The Foreign Priority data was omitted, please add in the left column of the title page after item [62] and before item [51] the following:

-- [30] Foreign Application Priority Data
February 17, 1997 [JP] Japan ............. 9-031917 --

Under References Cited, right column of the title page, please add the following reference:

-- 5,760,854 6/1998 Ono et al., 349/38 --

Signed and Sealed this

Eighteenth Day of September, 2001

*Attest:*

NICHOLAS P. GODICI
*Attesting Officer*   *Acting Director of the United States Patent and Trademark Office*